(12) United States Patent
Marechal et al.

(10) Patent No.: US 10,292,259 B2
(45) Date of Patent: May 14, 2019

(54) ELECTRICAL SHIELDING USING BAR VIAS AND ASSOCIATED METHODS

(71) Applicant: STMicroelectronics (Grenoble 2) SAS, Grenoble (FR)

(72) Inventors: Laurent Marechal, Bures sur Yvette (FR); Richard Rembert, Quaix en Chartreuse (FR); Jerome Lopez, Saint-Joseph-de-Riviere (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 15/142,213

(22) Filed: Apr. 29, 2016

(65) Prior Publication Data
US 2017/0318664 A1    Nov. 2, 2017

(51) Int. Cl.
*H02K 1/02* (2006.01)
*H05K 1/02* (2006.01)

(52) U.S. Cl.
CPC ......... *H05K 1/0251* (2013.01); *H05K 1/0222* (2013.01)

(58) Field of Classification Search
CPC .................................................. H05K 1/0228
USPC .......................................................... 174/266
See application file for complete search history.

(56) References Cited

U.S. PATENT DOCUMENTS

| 5,994,766 A * | 11/1999 | Shenoy | H01L 23/5225 257/659 |
|---|---|---|---|
| 6,713,685 B1 | 3/2004 | Cotton | |
| 6,936,764 B2 | 8/2005 | Groves et al. | |
| 7,404,250 B2 * | 7/2008 | Cheng | H05K 1/0222 174/266 |
| 8,502,085 B2 * | 8/2013 | Kim | H05K 1/0219 174/262 |
| 2002/0130739 A1 | 9/2002 | Cotton | |
| 2005/0247482 A1 * | 11/2005 | Nakamura | H05K 1/0222 174/262 |
| 2006/0237227 A1 * | 10/2006 | Zhao | H05K 1/0222 174/262 |
| 2007/0194431 A1 * | 8/2007 | Corisis | H01L 23/66 257/698 |
| 2015/0014045 A1 * | 1/2015 | Brigham | H05K 1/116 174/266 |
| 2015/0201499 A1 * | 7/2015 | Shinar | H05K 3/125 425/132 |

* cited by examiner

*Primary Examiner* — Stanley Tso
(74) *Attorney, Agent, or Firm* — Crowe & Dunlevy

(57) ABSTRACT

An electronic device disclosed herein includes a first conductor layer, a first nonconducting layer, and a second conductor layer in a stacked arrangement. A signal carrying conductive via is formed in the first nonconducting layer and extends between the first conductor layer and the second conductor layer. A shielding conductive via is formed in the first nonconducting layer, is not electrically coupled to the signal carrying conductive via, and substantially completely surrounds the signal carrying conductive via in spaced apart relation thereto.

9 Claims, 6 Drawing Sheets

ELECTRICAL SHIELDING USING BAR VIAS AND ASSOCIATED METHODS

TECHNICAL FIELD

This application related to the field of printed circuit boards or organic substrates, and more particularly, to the shielding of portions of such printed circuit boards or organic substrates using bar vias.

BACKGROUND

Designers of printed circuit boards (PCBs) and other circuit substrates endeavor to increase the functionality and capacity thereof. One enabling factor of this pursuit is the provision of more conductive traces that go from side to side and from layer to layer and in this way form interconnections between active electronic elements that are mounted on the PCB.

A common material PCB material in use is a glass-epoxy-based laminate with the PCBs being built in single-sided, double-sided, and even multilayer configurations. The laminate serves as an insulator between the adjacent conductive traces on the surface of the PCB (in single-sided and double-sided configurations), as well as between the multiple layers of conductive traces within the PCB (in multilayer configurations).

Electrical traces on different levels are connected by forming a hole in the laminate between the layers, and then plating the interior surface of this hole with a conductive material to form a "via".

As data and signal speeds have increased in PCBs, various challenges have arisen. One challenge is the carrying of a high frequency signal over a simple conductive trace on the surface of a PCB. Another challenge is the potential for electromagnetic interference between the signals carried on multiple conductive traces on the same PCB.

Yet another challenge lies in excessive electromagnetic radiation emanating from a PCB, which is produced by the high frequency signals carried by simple conductive traces on (or in) the PCB. This excessive emanation of electromagnetic radiation is undesirable for a variety reasons. First, it is a potential source of interference with other electronic equipment within an electronic device. In addition, it may also present a security problem since such emanation of electromagnetic radiation is susceptible to being intercepted and decoded by hostile parties.

Consequently, the development of advanced ways of shielding vias, conductive traces, and components of and on a PCB is desirable.

SUMMARY

An electronic device disclosed herein includes a first conductor layer, a first nonconducting layer, and a second conductor layer in a stacked arrangement. A signal carrying conductive via is formed in the first nonconducting layer and extends between the first conductor layer and the second conductor layer. A shielding conductive via is formed in the first nonconducting layer, is not electrically coupled to the signal carrying conductive via, and substantially completely surrounds the signal carrying conductive via in spaced apart relation thereto.

Another embodiment is directed to an electronic device including a first conductor layer, a first nonconducting layer, and a second conductor layer in a stacked arrangement. The electronic device also includes first and second signal carrying structures that are not directly electrically coupled. The first signal carrying structure has a first signal carrying conductive trace formed in the first conductor layer, a second signal carrying conductive trace formed in the second conductor layer, and a first signal carrying conductive via formed in the first nonconducting layer and coupling the first and second signal carrying conductive traces. The second signal carrying structure has a third signal carrying conductive trace formed in a selected one of the first conductor layer and the second conductor layer, and a second signal carrying conductive via formed in the first nonconducting layer to extend between the first and second conductor layers and being electrically coupled to the third signal carrying conductive trace. A shielding conductive structure substantially completely surrounds at least a portion of the first signal carrying structure and not the second signal carrying structure.

A method of making an electronic device includes forming a signal via extending between first and second opposed sides of a printed circuit board layer, and forming a bar via that extends between the first and second surfaces, that is not electrically connected to the signal via, and that substantially completely surrounds the signal via to form an electromagnetic shell.

DETAILED DESCRIPTION

In the following detailed description and the attached drawings and appendices, numerous specific details are set forth to provide a thorough understanding of the present disclosure. However, those skilled in the art will appreciate that the present disclosure may be practiced, in some instances, without such specific details. In other instances, well-known elements have been illustrated in schematic or block diagram form in order not to obscure the present disclosure in unnecessary detail. Additionally, for the most part, specific details, and the like, have been omitted inasmuch as such details are not considered necessary to obtain a complete understanding of the present disclosure, and are considered to be within the understanding of persons of ordinary skill in the relevant art.

Figure 1:
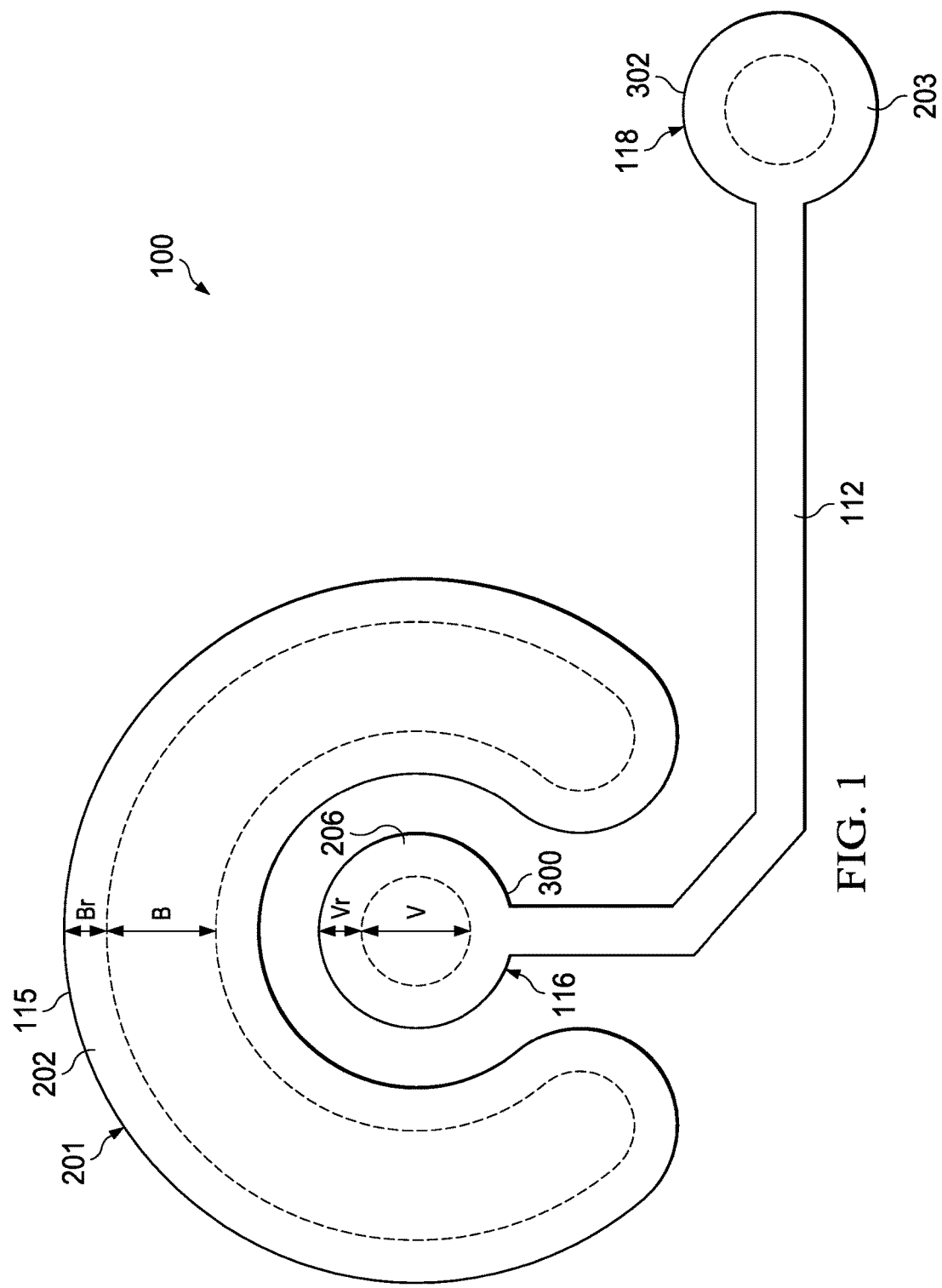
FIG. 1 is a top view of an electronic device in accordance with this disclosure.
Figure 2:
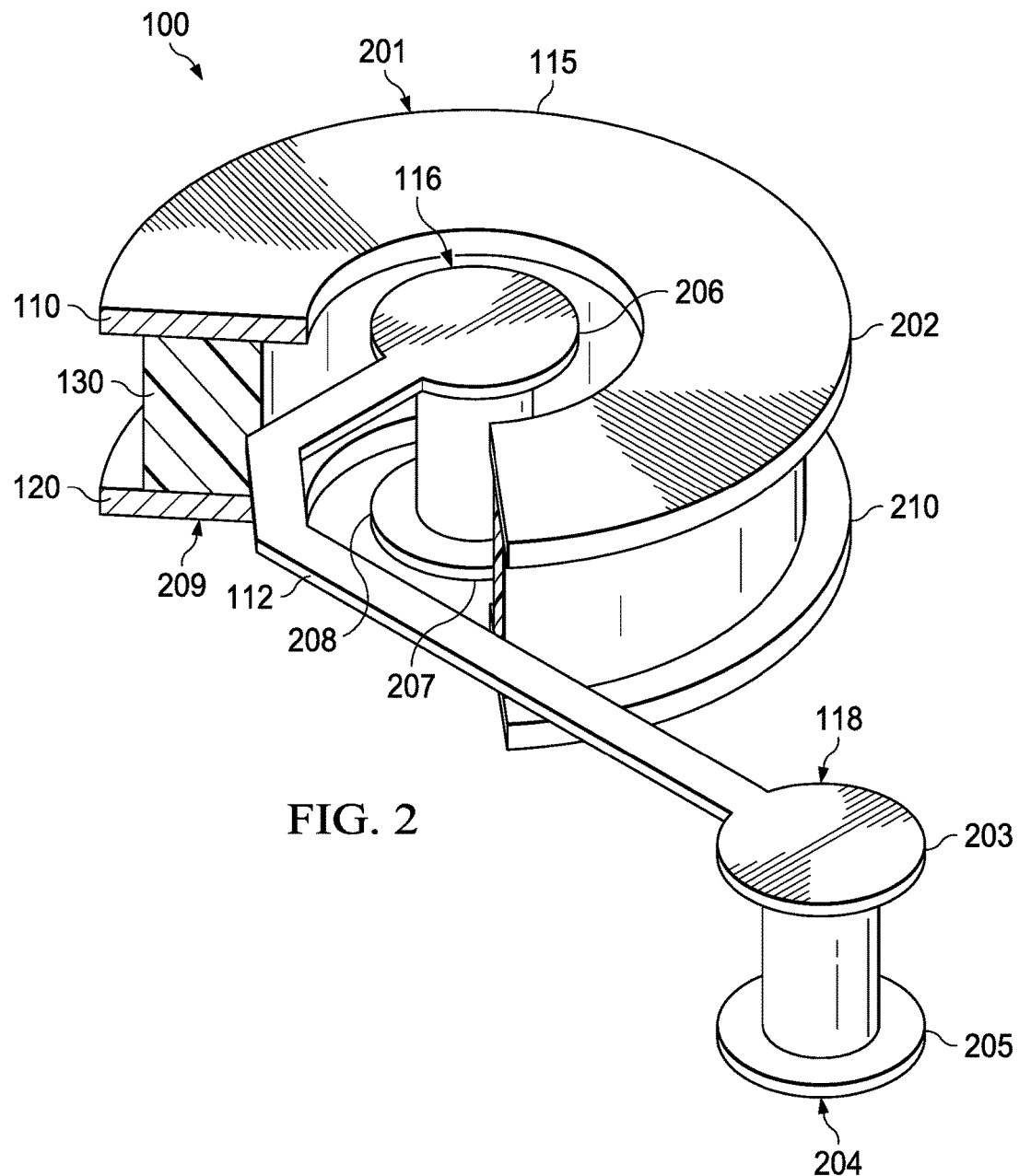
FIG. 2 is a cutaway view of the electronic device of FIG. 1.

With initial reference to FIGS. 1-2, an electronic device 100 is now described. The electronic device 100 is a printed circuit board (PCB), organic circuit substrate, or the like, and may be incorporated into any suitable or desired device.

A top side view of the electronic device 100 is shown in FIG. 1, and visible on the top side is a conductive trace 112 that couples a first conductive via 300 to a second conductive via 302. Also visible is a shielding conductive bar via 115 that runs adjacently to the first conductive via 300, and partially surrounds the first conductive via 300 in spaced apart relation thereto. The term bar via here refers to a conductive via having an elongated shape, by opposition to a standard via, which usually has a circular, point-like shape (in top view, as in FIG. 1). The shielding conductive bar via 115 is illustratively accurate in shape to conform to a shape of the first conductive via 300 and thus substantially completely surrounds the first conductive via 300, although the shielding conductive bar via 115 may take any desired shape.

As is perhaps best understood with reference to both FIG. 1 and FIG. 2, the exposed portions of the conductive vias 300 and 302 includes the via bodies 116, 118 themselves, and two ring lands 206, 203 extending around the periphery of the exposed surface of the via bodies 116, 118. These top ring lands 206, 203 are greater in diameter than the via bodies 116, 118. Similarly, the exposed portions of the shielding conductive bar via 115 includes the via body 201 and the top ring lands 202, which are greater in diameter than the via body 201.

Figure 4:
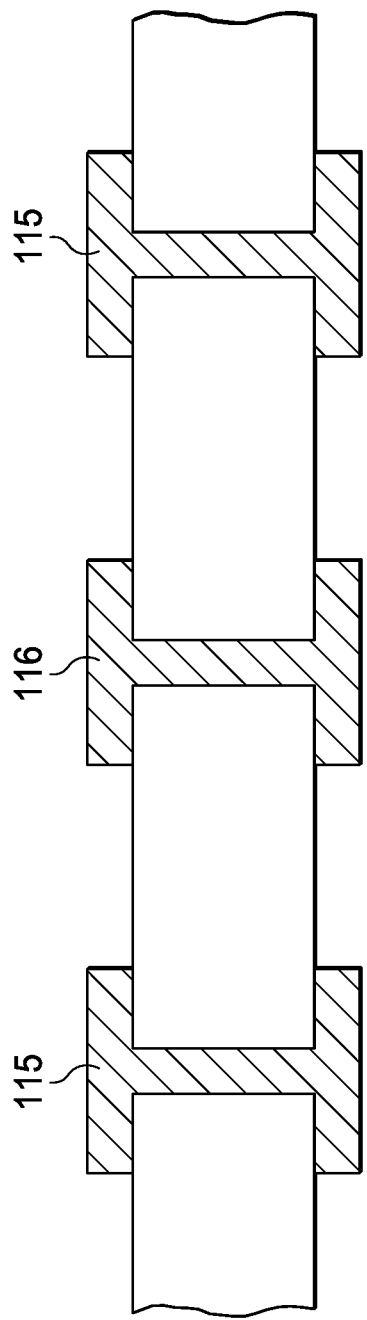
FIG. 4 is a cross-sectional view of the electronic device of FIG. 1.

As is best understood with referent to FIG. 2, the exposed portions described above form the first conductor layer 110, which is stacked on a first nonconducting layer 130, which is in turn stacked on a second conductor layer 120. The bottom ring lands 208, 210, 205, and bottom of the via bodies 207, 204 form the second conductor layer 120. Although the dielectric material of the first nonconducting layer 130 is not shown in FIG. 2, it should be appreciated that the vias 300 and 302 extend through the first nonconducting layer 130, as shown in FIG. 4. In addition, it can be seen that the first and second conductor layers 110 and 120 are lesser in thickness than the first nonconducting layer 130. While in some application the first conductor layer 110 and second conductor layer 120 may have a same thickness, in others they may have different thickness that are each less than the thickness of the first nonconducting layer 130.

It should be noted from the view of FIG. 2 that the shielding conductive bar via 115 is no greater in height than the via 300, and in particular that the via body 201 of the shielding conductive bar via 115 is no greater in height than the via bodies 116, 118 of the vias 300, 302 and that the ring land 206 is no greater in height than the ring land 202 Where a via 300 or 302 extends through multiple nonconducting layers, the shielding conductive bar via 115 may extend along a same path to shield that via, although as stated, may not be greater in height than the via that it is to shield. Thus, in some applications the conductive bar via 115 extends vertically through no more than one nonconducting layer, while in others it may extend vertically through more than one nonconducting layer.

Figure 3:
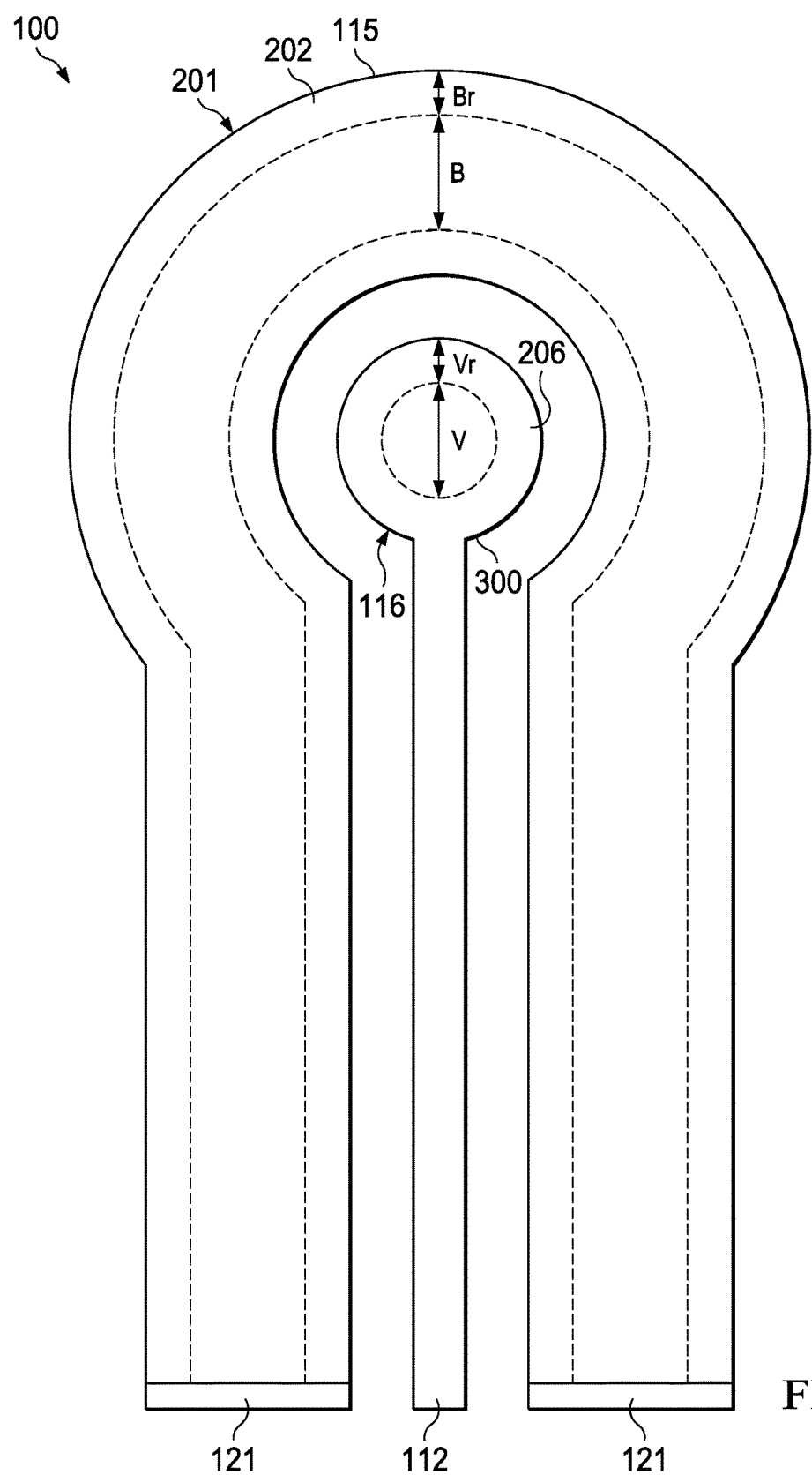
FIG. 3 is a top view of another electronic device in accordance with this disclosure.

The shielding conductive bar via 115 in the embodiment shown in FIG. 2 serves to shield the via 300, although in some applications, such as that shown in FIG. 3, it may extend horizontally beyond the via 300 so as to run adjacently to and substantially completely the conductive trace 112. Also, as shown, the conductive bar via 115 may extend horizontally along both lateral sides of the conductive trace 112, although it in some applications it may extend along but one lateral side of the conductive trace. The conductive bar via 115 may, for example as shown in FIG. 3, be coupled to a ground node 121, or may in some cases be left floating instead.

Although but one conductive trace 112 and but one shielding conductive bar via 115 are illustratively shown in FIGS. 1-3, in some applications there may be multiple such conductive traces, additional conductive vias, and additional shielding bar vias 115.

Of particular note is the fact that, as shown, the conductive bar via 115 serves to shield but one signal carrying structure (the vias 300 and 302 and the interconnecting conductive trace 112). Certain prior art shielding structures function so as to shield entire areas or swaths of their respective PCB's and serve to shield multiple signal carrying conductors. By shielding one signal carrying structure (or multiple signal carrying structures, but each shielded individually and not as a unit), the conductive bar via 115 taught herein allows for greater precision in shielding problem signals, and allows the shielding of multiple signal carrying structures from one another.

Figure 5:
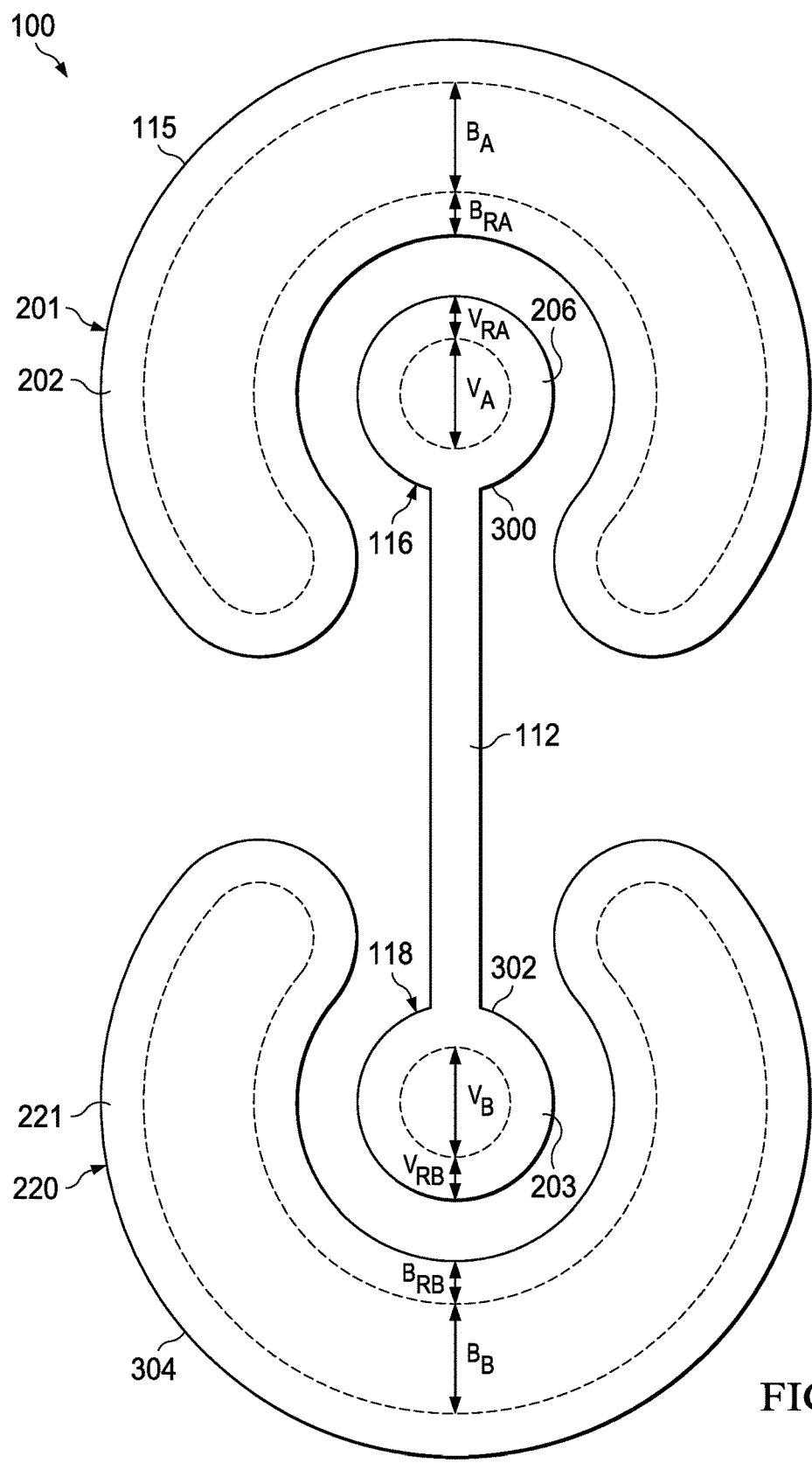
FIG. 5 is a top view of another electronic device in accordance with this disclosure.

As is now described with additional reference to FIG. 5, in the case where there are two vias 300 and 302 connected by a conductive trace 112, there may be a bar via 115 substantially completely surrounding the via 300, and a bar via 304 substantially completely surrounding the via 302, and these bar vias 115 and 304 are not electrically coupled with one another in some applications, while in others they may be electrically coupled with one another.

Figure 6:
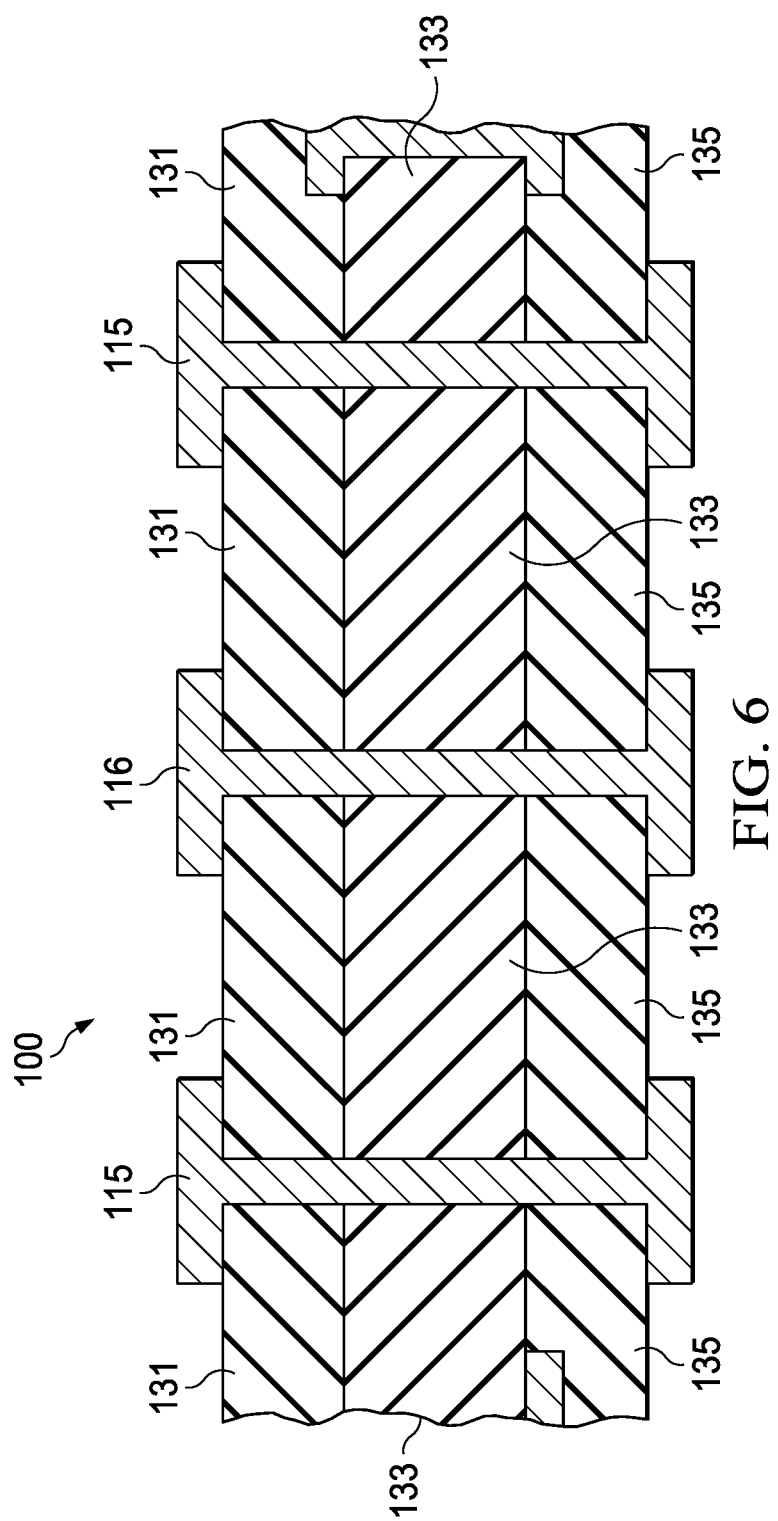
FIG. 6 is a cross-sectional view of another electronic device in accordance with this disclosure.

In addition, as shown in FIG. 6, the via 116 may extend through multiple dielectric layers 131, 133, 135, and thus the bar via 115 may also extend through those dielectric layers 131, 133, 135 to substantially completely surround the via body 116.

From the disclosures made herein, it should be apparent that the conductive shielding bar vias may take any suitable size and shape, and may be used to shield any individual signal or component. The conductive shielding bar vias may be formed by removing all or a portion of a nonconducting layer, such as with a laser, and then plating a conductive material, such as copper along the voids formed by the laser. The conductive shielding bar vias may also additionally or alternatively be formed photo lithographically.

Although vias 300 and 302, and shielding bar vias 115 and 304 have been depicted as fully filled conductive vias, this disclosure is not intended to be limited to this particular type of vias. Partially filled conductive vias could be used instead.

Although the preceding description has been described herein with reference to particular means, materials and embodiments, it is not intended to be limited to the particulars disclosed herein; rather, it extends to all functionally equivalent structures, methods, and uses, such as are within the scope of the appended claims.

The invention claimed is:

1. An electronic device, comprising:
   a first conductor layer, a first nonconducting layer, and a second conductor layer in a stacked arrangement;
   a first signal carrying conductive via formed in the first nonconducting layer and extending between the first conductor layer and the second conductor layer;
   a first shielding conductive via formed in the first nonconducting layer, not electrically coupled to the first signal carrying conductive via, and surrounding the first signal carrying conductive via in spaced apart relation thereto;
   wherein the first shielding conductive via forms an arcuate shape about the first signal carrying conductive via;
   a second signal carrying conductive via formed in the first nonconducting layer and extending between the first conductor layer and the second conductor layer;
   a second shielding conductive via formed in the first nonconducting layer, spaced apart from the first shielding conductive via, not electrically coupled to the second signal carrying conductive via, and surrounding the second signal carrying conductive via in spaced apart relation thereto;

wherein the second shielding conductive via forms an arcuate shape about the second signal carrying conductive via;

wherein the first shielding conductive via has a same height as the first signal carrying conductive via;

wherein the first shielding conductive via has an unchanging diameter along its entire vertical length in the first nonconductive layer;

wherein the second shielding conductive via has a same height as the second signal carrying conductive via;

wherein the second shielding conductive via has an unchanging diameter along its entire vertical length in the first nonconductive layer;

a signal carrying conductive trace formed in the first conductor layer and electrically coupling the first signal carrying conductive via to the second signal carrying conductive via;

and wherein the first and second shielding conductive vias at least partially surround the signal carrying conductive trace in spaced apart relation thereto.

2. The electronic device of claim 1, wherein the first shielding conductive via has a height no greater than a height of the first signal carrying conductive via.

3. The electronic device of claim 1, wherein the first shielding conductive via does not extend beyond the first and second conductor layers.

4. The electronic device of claim 1, wherein the first shielding conductive via does not more than partially surround conductive structures that are not directly electrically coupled to the first signal carrying conductive via.

5. The electronic device of claim 1, wherein the first shielding conductive via at least partially surrounds only conductive structures that are directly electrically coupled to the first signal carrying conductive trace.

6. The electronic device of claim 1, wherein the first shielding conductive via is coupled to a ground node.

7. The electronic device of claim 1, wherein the first shielding conductive via is electrically floating.

8. The electronic device of claim 1, wherein the first shielding conductive via and second conductive via are not electrically coupled to one another.

9. The electronic device of claim 1, wherein the signal carrying conductive trace lacks shielding other than by the first and second shielding conductive vias.

* * * * *